United States Patent
Lee et al.

(10) Patent No.: US 11,569,409 B2
(45) Date of Patent: Jan. 31, 2023

(54) TRANSFER HEAD ASSEMBLY AND LED TRANSFER APPARATUS

(71) Applicant: LG Display Co., Ltd., Seoul (KR)

(72) Inventors: Seungjun Lee, Seoul (KR); Myungsoo Han, Paju-si (KR); Kiyong Yang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 286 days.

(21) Appl. No.: 16/954,438

(22) PCT Filed: Sep. 20, 2018

(86) PCT No.: PCT/KR2018/011179
§ 371 (c)(1),
(2) Date: Jun. 16, 2020

(87) PCT Pub. No.: WO2019/124685
PCT Pub. Date: Jun. 27, 2019

(65) Prior Publication Data
US 2021/0083142 A1    Mar. 18, 2021

(30) Foreign Application Priority Data
Dec. 20, 2017 (KR) .................. 10-2017-0176334

(51) Int. Cl.
*H01L 33/00* (2010.01)
*H01L 25/075* (2006.01)
*H01L 21/67* (2006.01)

(52) U.S. Cl.
CPC ...... *H01L 33/005* (2013.01); *H01L 21/67144* (2013.01); *H01L 25/0753* (2013.01)

(58) Field of Classification Search
CPC .. B25J 15/008; B25J 15/0033; B25J 15/0038; B25J 15/0042; H01L 21/6838;
(Continued)

(56) References Cited

U.S. PATENT DOCUMENTS 6,646,662 B1 * 11/2003 Nebashi ................ B44C 1/22
257/E21.314
8,648,328 B2   2/2014 Crowder et al.
(Continued)

FOREIGN PATENT DOCUMENTS

CN    105518888 A    4/2016
JP    2003-023018 A  1/2003
(Continued)

OTHER PUBLICATIONS

PCT International Search Report, PCT/KR2018/011179, dated Apr. 3, 2019, 4 Pages.
(Continued)

*Primary Examiner* — Eric A. Ward
(74) *Attorney, Agent, or Firm* — Fenwick & West LLP

(57) ABSTRACT

Embodiments of the present disclosure relate to a transfer head assembly and an LED transfer apparatus, and more particularly, to a transfer head assembly and an LED transfer apparatus in which a plurality of pickup units picks up LEDs, which are adhered to the upper surfaces of the LEDs, and transfers the LEDs to a display substrate. According to the embodiments of the present disclosure, a large number of LEDs located on a wafer substrate or a carrier substrate can be transferred in bulk to a display substrate. Thus, it is possible to rapidly perform the transfer process of the LEDs.

20 Claims, 8 Drawing Sheets

(58) Field of Classification Search
CPC ..... H01L 21/683–68792; H01L 25/075–0756; H01L 33/00–648; H01L 2224/95085; H05K 13/0408–0413; H05K 13/0409
See application file for complete search history.

(56) References Cited

U.S. PATENT DOCUMENTS

| | | | |
|---|---|---|---|
| 8,685,774 | B2 | 4/2014 | Crowder et al. |
| 9,018,081 | B2 | 4/2015 | Crowder et al. |
| 9,252,328 | B2 | 2/2016 | Crowder et al. |
| 9,722,145 | B2 | 8/2017 | Sasaki et al. |
| 9,755,110 | B1 | 9/2017 | Crowder et al. |
| 9,823,885 | B2 | 11/2017 | Enokizono |
| 9,825,202 | B2 | 11/2017 | Schuele et al. |
| 9,842,823 | B2 | 12/2017 | Yu et al. |
| 9,892,944 | B2 | 2/2018 | Schuele et al. |
| 9,985,190 | B2 | 5/2018 | Zhan et al. |
| 10,032,957 | B2 | 7/2018 | Crowder et al. |
| 10,170,665 | B2 | 1/2019 | Zou et al. |
| 10,236,279 | B2 | 3/2019 | Ulmer et al. |
| 2011/0005931 | A1* | 1/2011 | Zhe ................. B81C 99/002 204/600 |
| 2013/0161584 | A1 | 6/2013 | Crowder et al. |
| 2013/0161643 | A1 | 6/2013 | Crowder et al. |
| 2014/0077158 | A1 | 3/2014 | Crowder et al. |
| 2015/0155455 | A1 | 6/2015 | Son |
| 2015/0214430 | A1 | 7/2015 | Zhan et al. |
| 2015/0221827 | A1 | 8/2015 | Crowder et al. |
| 2016/0190087 | A1 | 6/2016 | Yu et al. |
| 2016/0378413 | A1 | 12/2016 | Enokizono |
| 2016/0380158 | A1 | 12/2016 | Sasaki et al. |
| 2017/0133550 | A1 | 5/2017 | Schuele et al. |
| 2017/0133558 | A1 | 5/2017 | Sasaki et al. |
| 2017/0133564 | A1 | 5/2017 | Ulmer et al. |
| 2017/0139276 | A1 | 5/2017 | Ulmer et al. |
| 2017/0140961 | A1 | 5/2017 | Sasaki et al. |
| 2017/0179092 | A1 | 6/2017 | Sasaki et al. |
| 2017/0236798 | A1* | 8/2017 | Lee ................. H01L 21/6838 156/378 |
| 2017/0317242 | A1 | 11/2017 | Sasaki et al. |
| 2017/0338379 | A1 | 11/2017 | Zhan et al. |
| 2017/0338389 | A1 | 11/2017 | Zhan et al. |
| 2017/0372927 | A1 | 12/2017 | Schuele et al. |
| 2018/0005998 | A1 | 1/2018 | Ulmer |
| 2018/0012873 | A1 | 1/2018 | Lee et al. |
| 2018/0019223 | A1* | 1/2018 | Terada ................. H01L 24/81 |
| 2018/0004771 | A1 | 2/2018 | Ulmer |
| 2018/0029038 | A1 | 2/2018 | Sasaki et al. |
| 2018/0033915 | A1 | 2/2018 | Crowder et al. |
| 2018/0047867 | A1 | 2/2018 | Schuele et al. |
| 2018/0069148 | A1 | 3/2018 | Zou et al. |
| 2018/0138355 | A1 | 5/2018 | Zhan et al. |
| 2018/0144957 | A1 | 5/2018 | Schuele et al. |
| 2018/0158979 | A1 | 6/2018 | Schuele et al. |
| 2018/0219138 | A1 | 8/2018 | Sasaki et al. |
| 2018/0219139 | A1 | 8/2018 | Sasaki et al. |
| 2018/0309023 | A1 | 10/2018 | Crowder et al. |
| 2018/0351030 | A1* | 12/2018 | Goward ............ H01L 21/67144 |
| 2019/0027639 | A1* | 1/2019 | Yoon ................. H01L 24/81 |
| 2019/0139794 | A1* | 5/2019 | Saketi ................. H01L 21/68 |
| 2019/0252350 | A1* | 8/2019 | Schwarz ............. H01L 24/75 |

FOREIGN PATENT DOCUMENTS

| | | |
|---|---|---|
| JP | 2007-210081 A | 8/2007 |
| JP | 2008-159724 A | 7/2008 |
| KR | 10-2014-0062572 | 5/2014 |
| KR | 10-1683398 B1 | 12/2016 |
| KR | 101741333 B1 | 5/2017 |
| WO | WO 2017/119786 A1 | 7/2017 |

OTHER PUBLICATIONS

Bark, C., et al., "Gripping with Low Viscosity Fluids," IEEE Micro Electro Mechanical Systems 1998 Proceedings, The Eleventh Annual International Workshop on Heidelberg, Germany, Jan. 25-29, 1998, pp. 301-305, New York.

* cited by examiner

[Fig. 1]
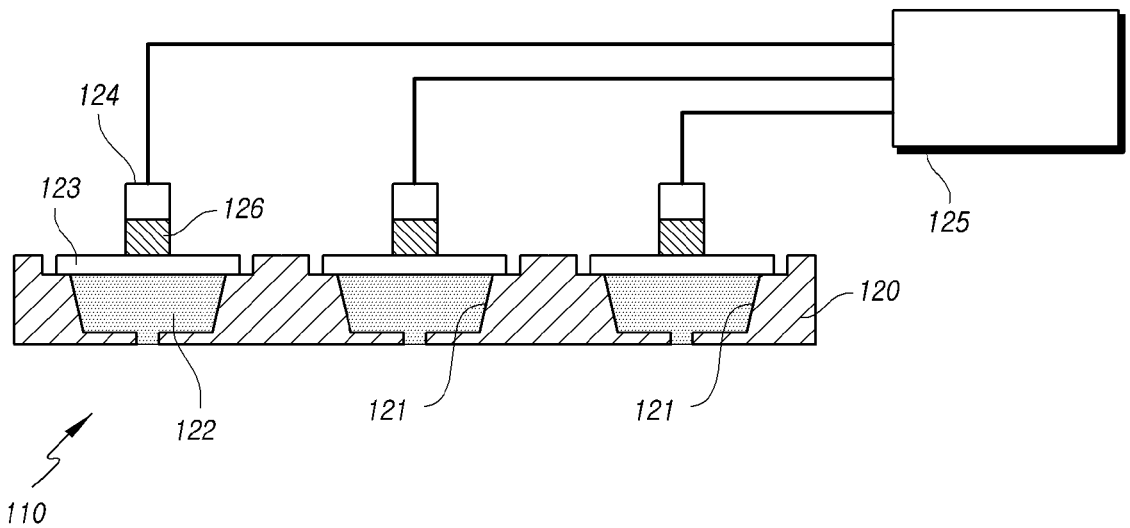
[Fig. 2]
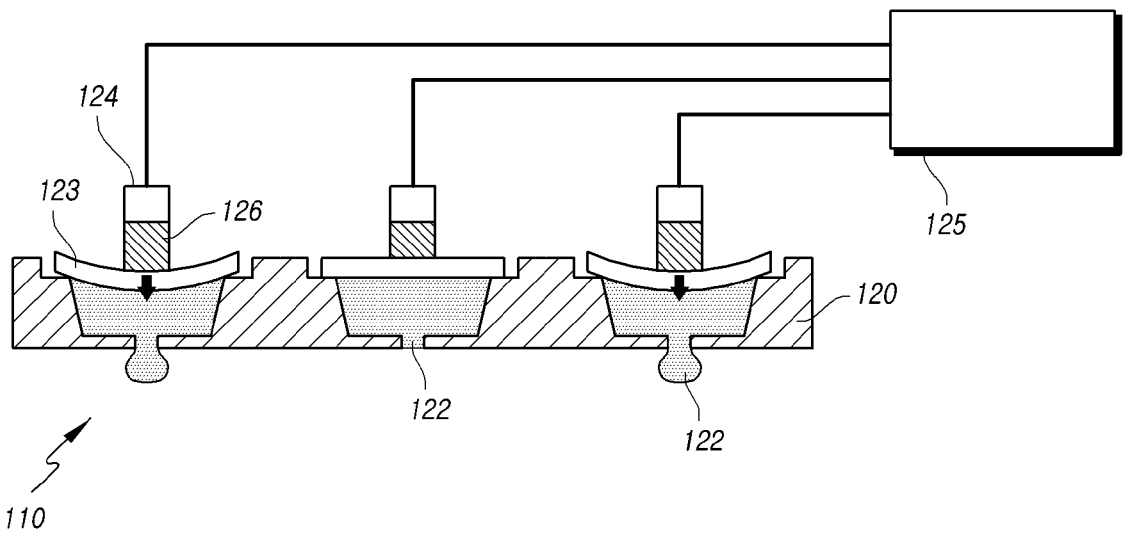

[Fig. 3]
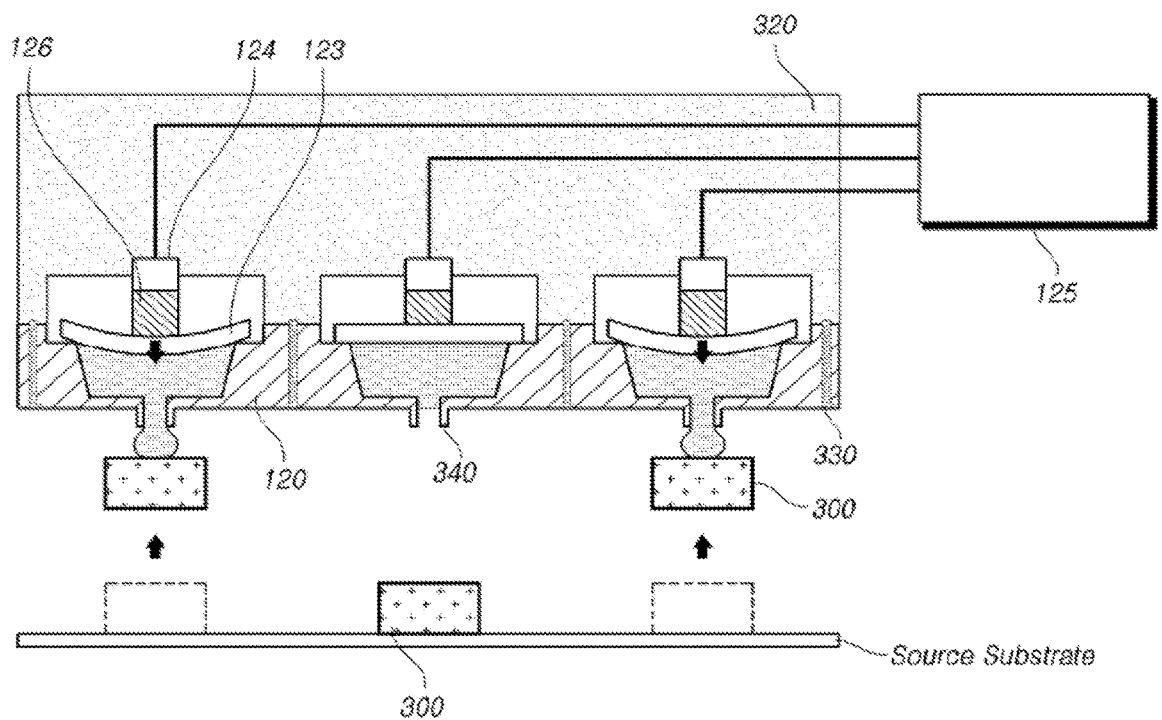
[Fig. 4]
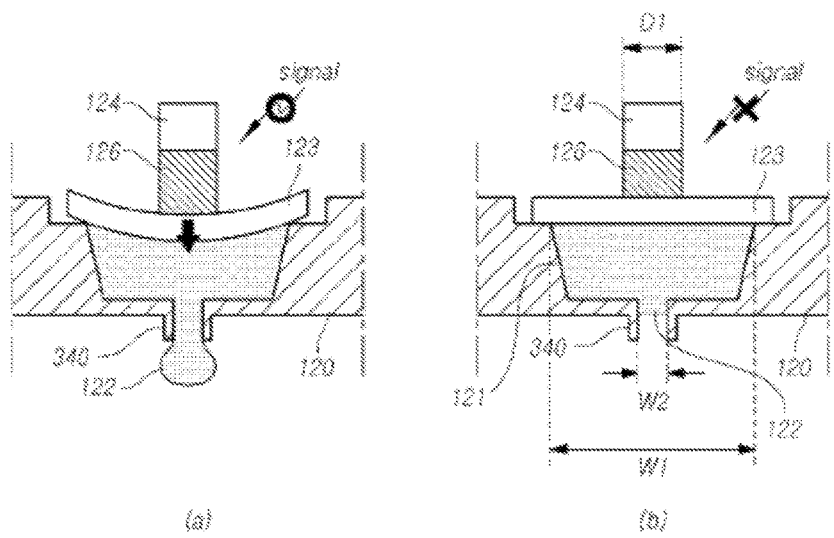

[Fig. 5]
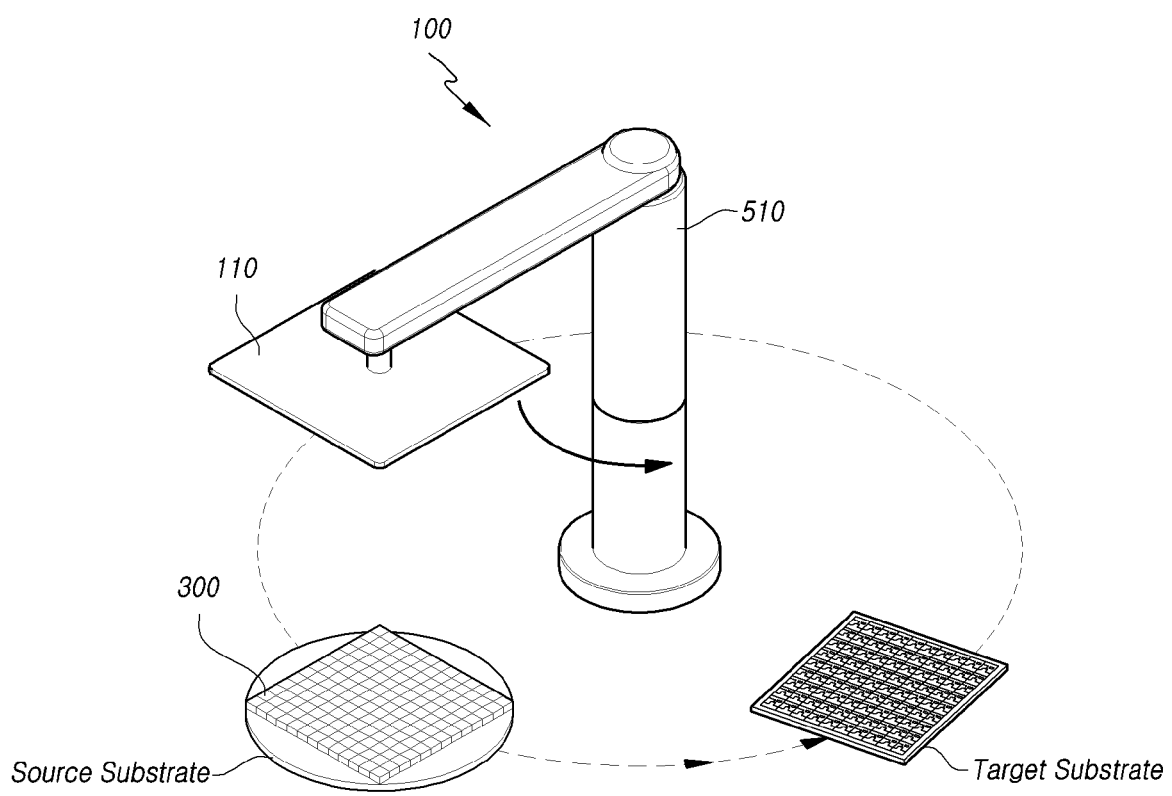

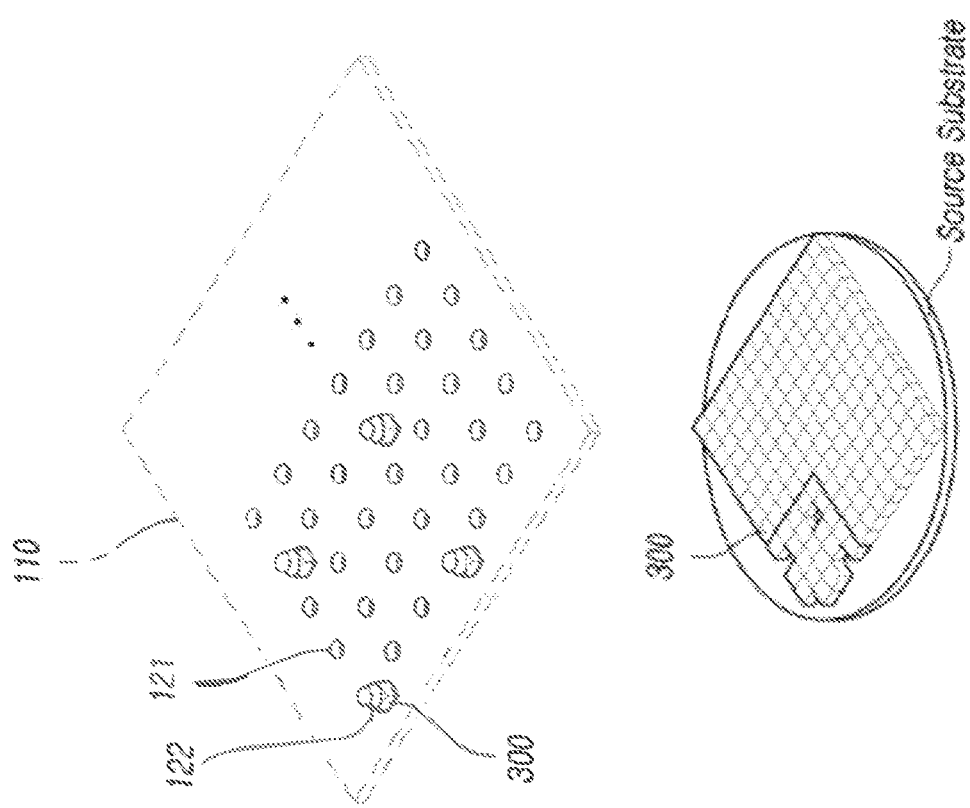
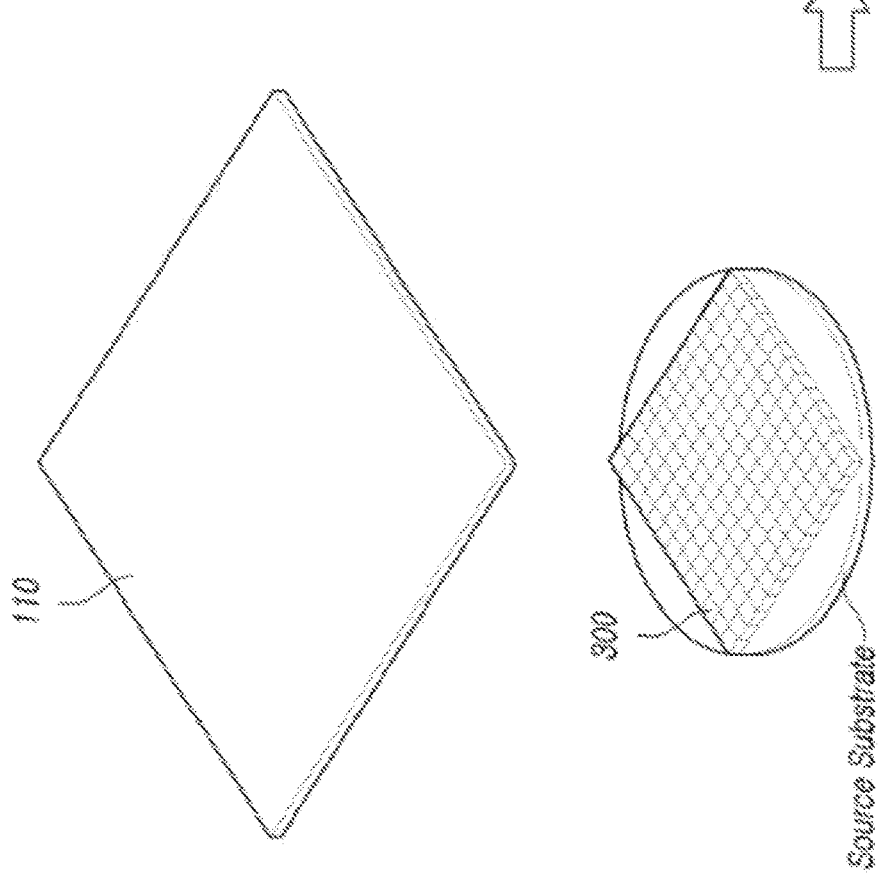
[Fig. 6]

[Fig. 7]
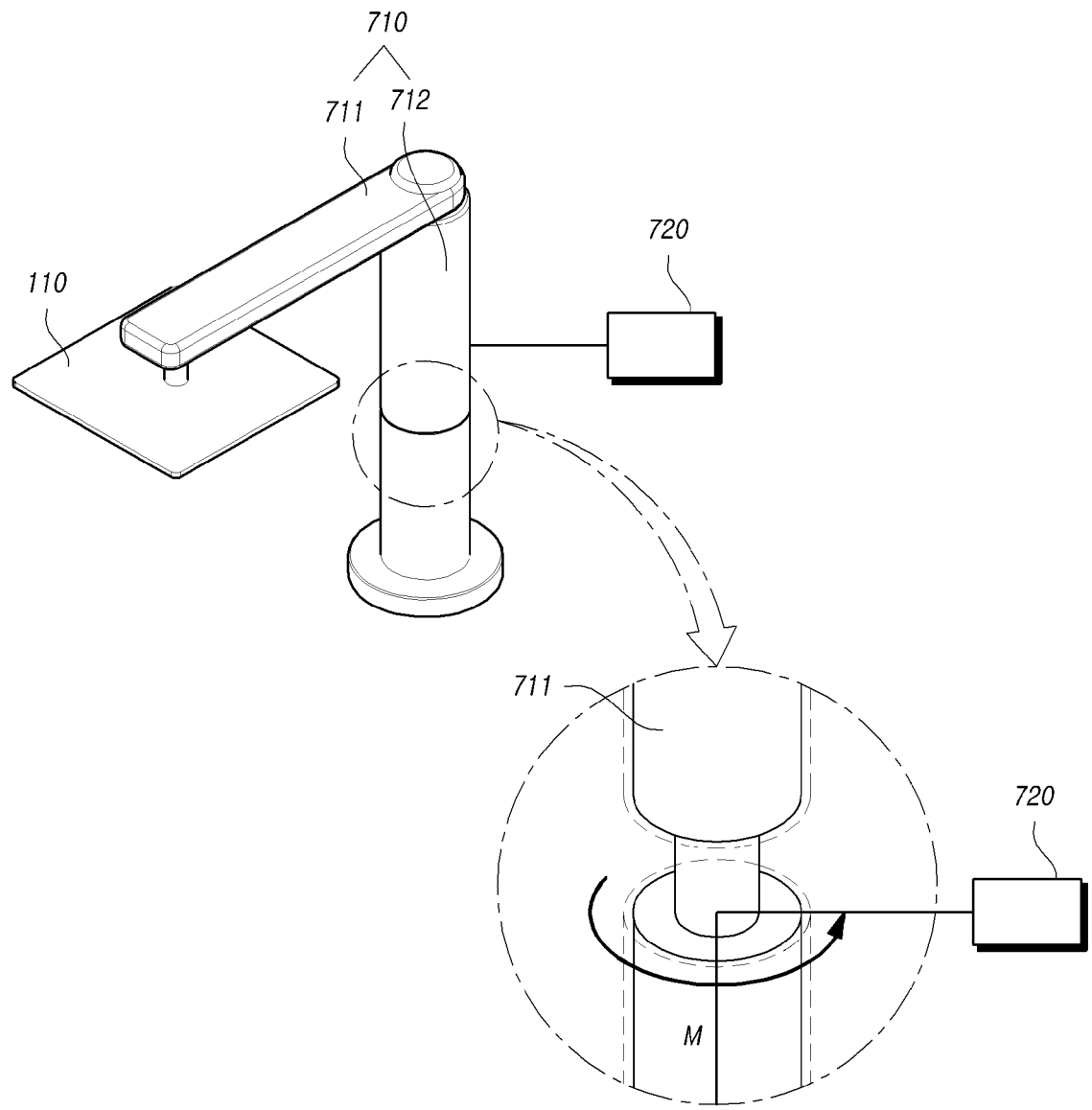

[Fig. 8]
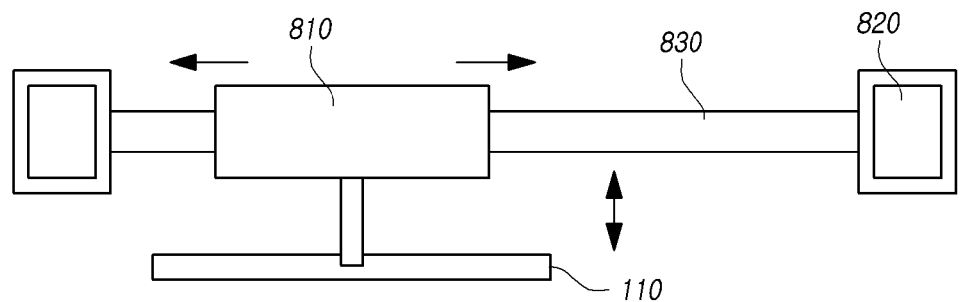
(a)
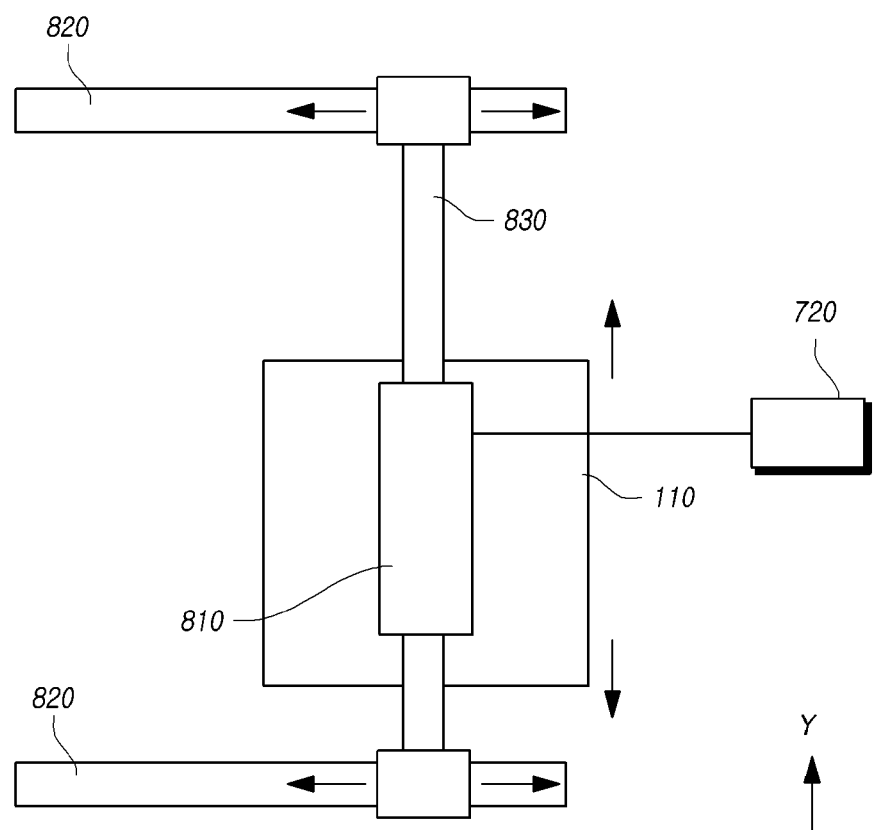
(b)

[Fig. 9]
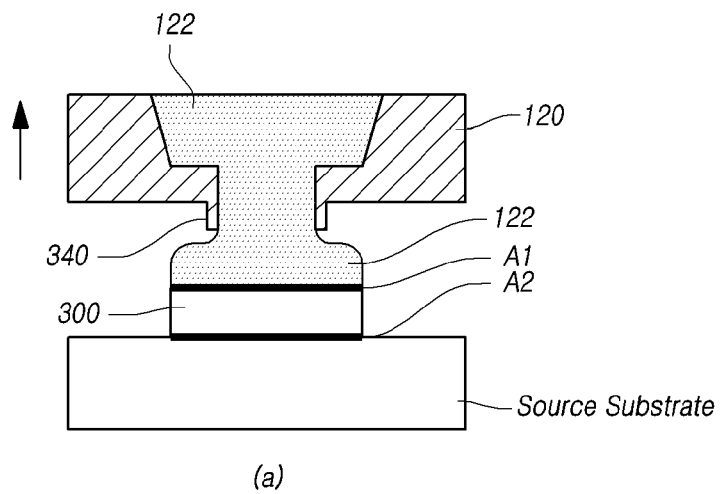
(a)
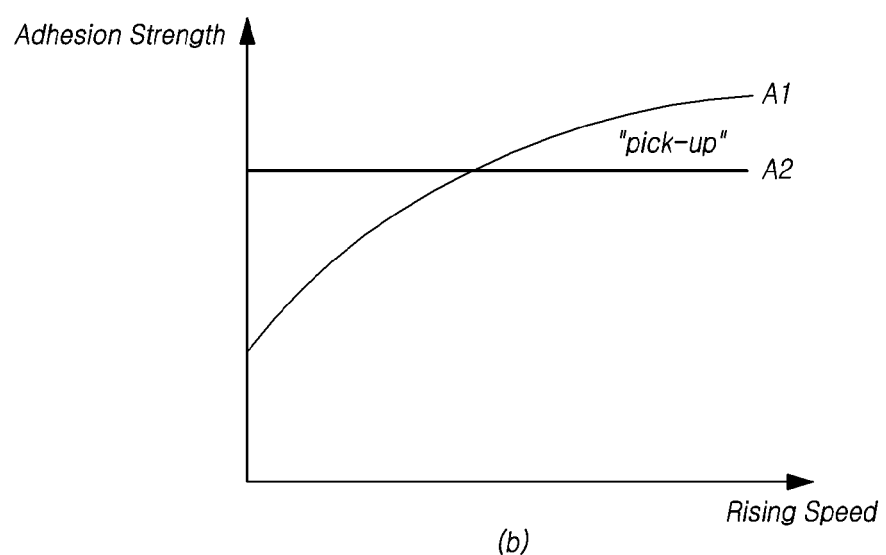
(b)

[Fig. 10]
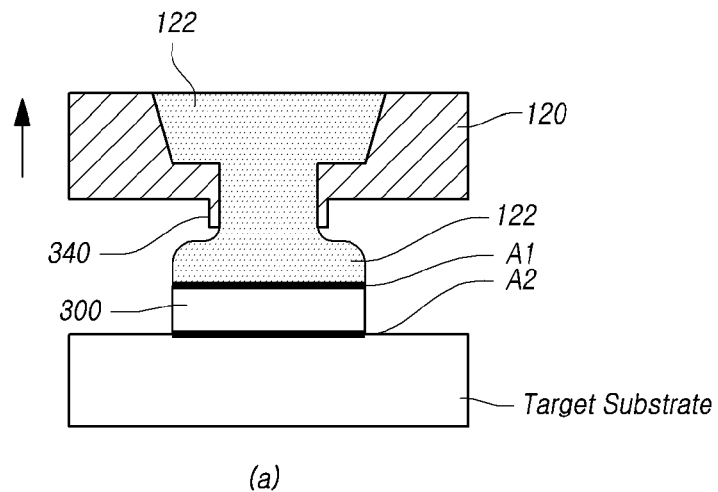
(a)
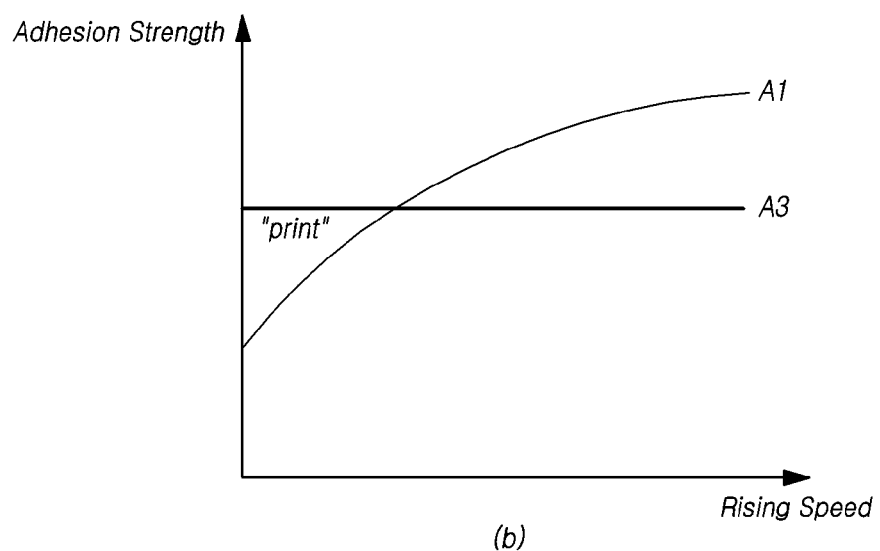
(b)

TRANSFER HEAD ASSEMBLY AND LED TRANSFER APPARATUS

TECHNICAL FIELD

Embodiments disclosed herein relate to a transfer head assembly and a light-emitting device (LED) transfer apparatus.

BACKGROUND ART

As the information-oriented society has been developed, demand for a display device for displaying an image is increasing in various forms. Recently, various display devices such as a liquid crystal display device, an organic light-emitting display device, and the like have been utilized.

Such display devices may include a display panel in which a plurality of sub-pixels is arranged, and various drive circuits for driving the sub-pixels, such as a gate drive circuit, a data drive circuit, and the like.

In a conventional display device, a display panel is configured by arranging transistors, various electrodes, various signal lines, and the like on a substrate, and a drive circuit that may be implemented as an integrated circuit is mounted on a printed circuit so as to be electrically connected to the display panel.

Such a display panel is becoming thinner as technology advances, thereby enabling a light-weighted display device to be realized.

Recently, a display device (hereinafter, also referred to as a micro display device) using a micro light-emitting diode (LED) having a structure suitable for a small-sized display device has appeared. The LED means an ultra-small LED having a size of several tens of m or less.

Such a micro display device uses LEDs themselves as pixels, and can be miniaturized and light-weighted, thereby providing various advantages in that it can be variously utilized in a smart watch, a mobile device, a virtual reality device, an augmented reality device, a flexible display device, etc.

In order to manufacture a micro display device, it is necessary to crystallize a plurality of LEDs on a semiconductor wafer substrate such as sapphire or silicon (Si), and to move the plurality of crystallized LEDs to a substrate having drive elements. A precise transfer process of placing the LEDs at positions corresponding to respective pixels is required.

Unlike conventional LEDs, such a transfer process requires precise processing because it is necessary to control diode chips having a size of several tens of μm, which is as small as a pixel size.

Since each pixel corresponds to a LED, it is necessary to transfer a large number of diode chips to a substrate on which drive devices are arranged.

However, a conventional transfer process or equipment have disadvantages in that a long time is taken for a transfer process because diode chips are picked up and transferred to a substrate one by one, and in that yield reduction or the like may be caused due to damage to diode chips because an adsorption or attraction method using air pressure or static electricity is mainly used.

Therefore, there has been a need to improve this.

DISCLOSURE OF INVENTION

Solution to Problem

In view of the foregoing, an embodiment of the present disclosure is to provide a transfer head assembly and an LED transfer apparatus capable of transferring in bulk a large number of LEDs located on a wafer substrate or a carrier substrate to a display substrate.

Another embodiment of the present disclosure is to provide a transfer head assembly and an LED transfer device capable of selectively transferring a plurality of LEDs located on a wafer substrate or a carrier substrate to a display substrate.

Still another embodiment of the present disclosure is to provide a transfer head assembly and an LED transfer device capable of transferring a plurality of LEDs located on a wafer substrate or a carrier substrate to a display substrate while applying the minimum external force to the plurality of LEDs.

In addition, the embodiments of the present disclosure are not limited those described above, and other aspects not mentioned above can be clearly understood by a person ordinarily skilled in the art from the following description.

In order to achieve the aspects described above, embodiments of the present disclosure provide a transfer head assembly and an LED transfer apparatus, in which a plurality of pickup units corresponding to a plurality of LEDs located on a wafer substrate or a carrier substrate picks up the LEDs and transfers the LEDs to a display substrate.

Embodiments of the present disclosure provide a transfer head assembly and an LED transfer apparatus, in which a plurality of pickup units selectively pick up the LEDs by driving actuators each including a piezo ceramic and transfers the picked-up LEDs to a display substrate.

In addition, embodiments of the present disclosure provide a transfer head assembly and an LED transfer device in which a plurality of pickup units picks up LEDs by adhering to the upper surfaces of the LEDs, and transfers the LEDs to a display substrate.

As described above, according to the embodiments of the present disclosure, a large number of LEDs located on a wafer substrate or a carrier substrate can be transferred in bulk to a display substrate. Thus, it is possible to rapidly perform the transfer process of the LEDs.

According to the embodiments of the present disclosure, a plurality of LEDs located on a wafer substrate or a carrier substrate can be selectively transferred to a display substrate. Thus, it is possible to facilitate the repair process of defective or low-quality LEDs.

In addition, according to the embodiments of the present disclosure, a plurality of LEDs located on a wafer substrate or a carrier substrate can be transferred to a display substrate while applying the minimum external force to the LEDs. Thus, it is possible to reduce the possibility of damaging the LEDs.

BRIEF DESCRIPTION OF DRAWINGS

FIG. 1 is a view schematically illustrating a transfer head assembly according to embodiments of the present disclosure;

FIG. 2 is a view schematically illustrating a state in which the transfer head assembly of FIG. 1 is partially operated;

FIG. 3 is a view illustrating an operating state of the transfer head assembly according to embodiments of the present disclosure;

FIG. 4 is a view illustrating an operating principle of the transfer head assembly according to embodiments of the present disclosure;

FIG. 5 is a view schematically illustrating an operation of an LED transfer apparatus according to embodiments of the present disclosure;

FIG. 6 is a view illustrating an operating state of the LED transfer apparatus according to embodiments of the present disclosure;

FIG. 7 is a view illustrating an example of the LED transfer apparatus according to embodiments of the present disclosure;

FIGS. 8A and 8B are views illustrating another example of the LED transfer apparatus according to embodiments of the present disclosure;

FIGS. 9A and 9B are views illustrating an operating principle of some components of the LED transfer apparatus according to embodiments of the present disclosure; and FIGS. 10A and 10B are views differently illustrating an operating principle of some components of the LED transfer apparatus according to embodiments of the present disclosure.

MODE FOR THE INVENTION

Hereinafter, some embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element is connected to, is coupled to, or is in contact with another structural element, it should be interpreted that another structural element may be connected to, be coupled to, or be in contact with the structural elements as well as that the certain structural element is directly connected to or is in direct contact with another structural element.

FIG. 1 is a view schematically illustrating a transfer head assembly according to embodiments of the present disclosure, FIG. 2 is a view schematically illustrating a state in which the transfer head assembly of FIG. 1 is partially operated, FIG. 3 is a view illustrating an operating state of the transfer head assembly according to embodiments of the present disclosure, and FIG. 4 is a view illustrating an operating principle of the transfer head assembly according to embodiments of the present disclosure. FIG. 5 is a view schematically illustrating an operation of an LED transfer apparatus according to embodiments of the present disclosure, FIG. 6 is a view illustrating an operating state of the LED transfer apparatus according to embodiments of the present disclosure, and FIG. 7 is a view illustrating an example of the LED transfer apparatus according to embodiments of the present disclosure. FIG. 8 is a view illustrating another example of the LED transfer apparatus according to embodiments of the present disclosure, FIG. 9 is a view illustrating an operating principle of some components of the LED transfer apparatus according to embodiments of the present disclosure, and FIG. 10 is a view differently illustrating an operating principle of some components of the LED transfer apparatus according to embodiments of the present disclosure.

Referring to FIGS. 1 and 3, an LED transfer apparatus 100 according to various embodiments may include a transfer head assembly 110 and a fixing device 510 to be described later.

The transfer head assembly 110 is a component configured to pick up a plurality of LEDs 300 from a wafer substrate or a carrier substrate and to transfer or place(print) the LEDs 300 to or on a display substrate on which a pixel circuit or the like is implemented. At this time, the wafer substrate or the carrier substrate may be referred to as a source substrate and the display substrate may be referred to as a target substrate.

LEDs 300 to be picked up by the transfer head assembly 110 may be various types of devices that emit light. For example, the LEDs may be LED chips or LED chips having a size of several tens of m or less.

Such LED chips or LED chips can be manufactured by crystallizing an inorganic material such as GaN on a semiconductor wafer substrate such as sapphire or silicon (Si).

The process of crystallizing LED chips or LED chip is also referred to as an epitaxy, epitaxial growth, or epitaxial process. The epitaxial process means a process of taking a specific orientation relationship on a surface of a crystal and growing the crystal. In order to form an device structure of an LED chip or a LED chip, it is necessary to stack a GaN-based compound semiconductor on a substrate in the form of a pn junction diode. In this case, each layer is grown by inheriting the crystallinity of the underlying layer thereof.

In addition, the LED chip or the LED chip may include an n-doped n-type semiconductor layer, at least one multi-quantum well (MQW) layer and a p-doped p-type semiconductor layer.

The n-type semiconductor layer is made of a semiconductor material such as GaN, AlGaN, InGaN, AlInGaN, and the like, and Si, Ge, Se, Te, C, or the like may be included as impurities.

The p-type semiconductor layer is made of a semiconductor material such as GaN, AlGaN, InGaN, AlInGaN, and the like and Mg, Zn, Be, and the like may be included as impurities.

The MQW layer may have an MQW structure of, for example, InGaN/GaN or the like.

Such an MQW layer may emit light of any one of red, green, and blue or may emit light of another color. For example, when the MQW layer includes an InGaAlP material, the MQW layer may emit red light, and when the MQW layer includes an InGaN material with a different content of In, green or blue light may be emitted.

An LED chip or a LED chip crystallized on a growth substrate as described above is transferred to the substrate of a display panel on which a pixel circuit or the like is implemented. To remove the LED chip or the LED chip from the growth substrate may be referred to as pickup, and accurately positioning the LED chip or the LED chip at a corresponding position on the display panel substrate may be referred to as transfer or placement(printing). However, the term transfer may be used to include pickup and placement(printing) of the above-described LED chip or LED chip.

For this pickup/placement (printing) or transfer process, a transfer head assembly 110 is provided.

The transfer head assembly 110 includes a head plate 120 having therein a plurality of through holes 121.

The head plate 120 may be a flat plate having a thickness, and may be made of various materials such as a metal, a polymer resin, or the like.

On the head plate 120, a plurality of through holes 121 passing through one face and the other face of the head plate 120 may be disposed.

The plurality of through holes 121 may be arranged to have a predetermined spacing. The through holes 121 may be arranged to have the same or similar spacing as the spacing of the LEDs 300 arranged on the source substrate or the target positions of the target substrate for picking up the LEDs 300.

The transfer head assembly 110 includes a plurality of pickup units 122, which respectively corresponds to the plurality of through holes 121 and includes an adhesive material filled in the plurality of through holes 121.

The pickup units 122 are components configured to attach a plurality of LEDs 300 thereto, and is formed of a sticky adhesive material. Such pickup units 122 may each include a viscoelastic adhesive material, and may include polydimethylsiloxane (PDMS) as an example of the viscoelastic adhesive material. However, the present disclosure is not limited thereto, and the pickup units 122 may be made of another viscoelastic adhesive material.

The plurality of pressing units 123 may be provided to cover the upper portions of the plurality of through holes 121 so as to correspond to the plurality of pickup units 122, respectively.

The pressing units 123 may cover the upper portions of the plurality of through holes 121, that is, the upper opening portions of the through holes 121 so as to correspond to the plurality of pickup units 122, respectively.

For example, the pressing units 123 may be flat plates, which may be referred to as pressing plates or vibration plates.

The pressing units 123 may apply pressure to the plurality of pickup units 122 in accordance with the pressure applied to the upper surfaces of the pressing units 123, respectively.

Meanwhile, in order to apply pressure to the upper surfaces of the pressing units 123, a plurality of actuators 124 may be positioned on the pressing units 123 so as to apply pressure to the upper surfaces of the plurality of pressing units 123, respectively.

The actuators 124 are components driven by electricity, hydraulic pressure, pneumatic pressure, or the like so as to perform mechanical work. The actuators 124 may be driven to apply pressure to the upper surfaces of the pressing units 123.

In order to drive the plurality of actuators 124, a drive circuit 125 may be included. In the case in which the actuators 124 are operated by an electric signal, the drive circuit 125 may be configured to drive the actuators 124 by applying an electric signal to each of the actuators 124 through a signal wire connected thereto, and in the case in which the actuators 124 are operated by hydraulic pressure or pneumatic pressure, the drive circuit 125 may be configured to apply a drive signal for generating the corresponding hydraulic pressure or pneumatic pressure so as to drive the actuators 124.

Meanwhile, the actuator 124 may be a piezoelectric actuator that generates a load by polarization of a piezoelectric ceramic 126 provided therein.

More specifically, the piezoelectric ceramic 126 of the actuator 124 may have a structure in which polycrystalline plumbum (lead) zirconate titanate (PZT) ceramic is stacked. Such a PZT ceramic may be obtained by mixing lead titanate (PbTiO$_3$) and lead zirconate (PbZrO$_3$) in a predetermined ratio.

When a voltage is applied to the actuator 124 including the piezoelectric ceramic 126, the piezoelectric ceramic 126 can generate a load while being expanded due to the polarization of the piezoelectric ceramic 126 in the laminated structure. The load of the actuator 124 can be transmitted to the upper surface of the pressing unit 123 described above.

Meanwhile, the plurality of pressing units 123 described above may be configured to apply pressure to the plurality of the pickup units 122 by themselves rather than being configured to receive a load generated and provided by the actuators 124.

That is, the plurality of pressing units 123 may include the piezoelectric ceramic 126 therein, and may be configured to generate a load by the polarization of the piezoelectric ceramic 126 so as to apply pressure to the pickup units 122. In the structure of the pressing unit 123 described above, pressure can be applied to the pickup unit 122 only by the pressing unit 123 without a separate actuator 124.

In above case, the pressing units 123 may be disposed to be overlapped with an upper opening of the through holes 121 and an upper surface of the pickup units 122. That is, pressure by an expansion of the pressing units 123 may be delivered entirely to the pickup units 122, since the pressing units 123 is disposed to be overlapped fully with the upper surface of the pickup units 122.

Meanwhile, the actuator 124 including the piezoelectric ceramic 126 may include a post that fixes and supports the piezoelectric ceramic 126 included therein such that force generated by the expansion of the piezoelectric ceramic 126 due to the voltage applied thereto is transmitted to the upper surface of the pressing unit 123.

In order to drive the actuator 124 including the piezoelectric ceramic 126, the drive circuit 125 may apply an electric signal to the piezoelectric ceramic 126 through a signal wire electrically connected to the piezoelectric ceramic 126 so as to adjust the expansion and contraction of the piezoelectric ceramic 126. The signal wire of the drive circuit 125 may be disposed or included in a base plate 320 to be described later.

Referring to FIGS. 2 and 4, the drawings illustrate a state in which among the plurality of actuators 124 including the piezoelectric ceramic 126, some actuators 124 are operated and some actuators are not operated.

The pickup units 122 are extruded from the inside of the plurality of through holes 121 to the lower side of the head plate 120 due to the pressure, which is applied to the pickup units 122 by the pressing units 123 as the load generated by the driving of the plurality of actuators 124 is transferred to the upper surfaces of the plurality of pressing units 123.

That is, since the pickup units 122 are made of a viscoelastic adhesive material, the pickup units are positioned inside the through holes 121 when pressure is not applied separately. However, when the pressing units 123 apply pressure to the pickup units 122, the pickup units 122 can be extruded such that the pickup units 122 flow out to the lower openings of the through holes 121 due to the applied pressure.

Meanwhile, when the pressing units 123 are in the form of pressing plates or vibrating plates, the load generated by the driving of the actuators 124 is applied to the upper surfaces of the pressing units 123. Due to this, the pressing units 123 are partially bent to be able to apply pressure to the pickup units 122.

In this way, when the load generated by the driving of the actuators 124 applies pressure to the pickup units 122 while bending the pressing units 123, the load generated by the actuators 124 is uniformly applied to the pickup units 122 such that the degree of extrusion of the pickups 122 can be easily adjusted.

Meanwhile, the drive circuit 125 may be connected to each of the plurality of actuators 124 through signal wires so as to drive the plurality of actuators 124 independently.

The plurality of actuators 124 including the piezoelectric ceramic 126 are configured such that, in response to a drive signal individually provided through the signal wires in the drive circuit 125, the actuators 124 to which the signal is applied generate and transfer a load to the pressing units 123 and the actuators 124 to which the signal is not applied do not generate a load. Therefore, only the pickup units 122 corresponding to the actuators 124 to which the signal is applied are extruded to the lower side of the head plate 120.

Meanwhile, referring to FIG. 4B, the plurality of through holes 121 included in the head plate 120 may be configured such that the width W2 of the lower opening of each of the through holes 121 is relatively smaller than the width W1 of the upper opening.

In this case, since the width W2 of the lower opening of each through hole 121 is smaller than the width W1 of the upper opening of the through hole 121, even if the pressure applied to the upper portion of the pickup unit 122 is small, the pickup unit 122 can be provided with force for causing the pickup unit 122 to be extruded, so that the extrusion of the pickup unit 122 can be facilitated.

In addition, the plurality of through holes 121 included in the head plate 120 may be configured such that the width W2 of the lower opening of each of the through holes 121 is relatively smaller than the width D1 of each of the plurality of actuators 124.

In this case, since it is easy to adjust the width W2 of the lower opening of the through hole 121 compared with reducing the width D1 of the actuator 124, reduction of the size of which is limited in size reduction, the pickup unit 122 is able to pick up an LED 300 such as a LED which is further downsized, in accordance with the size of the LED 300.

Meanwhile, referring to FIG. 3 again, the transfer head assembly 110 may further include a base plate 320 coupled to the head plate 120 on the upper side of the head plate 120.

The base plate 320 is coupled to the head plate 120 and may serve as a housing for protecting components such as the pickup units 122, the pressing units 123, and the actuators 124 included in the head plate 120.

In addition, the base plate 320 supports the plurality of actuators 124 such that the load generated in the actuators 124 is transmitted toward the positions of the pressing units 123 so that the pressing units 123 are able to apply pressure to the pickup units 122.

The base plate 320 may be coupled to the head plate 120 such that the head plate 120 is detachable from the base plate 320. For example, the base plate 320 and the head plate 120 may be coupled to each other through coupling members such as screws 330, and the screws 330 may be fastened or released so as to mount or detach the head plate 120. These screws 330 may be implemented as other types of coupling members.

In this case, when the pickup units 122 including the adhesive material are used a plurality of times for pickup of LEDs 300 so that the viscosity of the adhesive material is reduced, it is possible to perform repair by replacing the pickup units 122 after the head plate 120 is detached from the base plate 320. Thus, it is possible to increase a durability term of the transfer head assembly 110 or the LED transfer apparatus 100 and to decrease the cost of replacing the transfer head assembly 110 or the LED transfer apparatus.

Meanwhile, on the lower surface of the head plate 120, a plurality of protrusion members 340 may be provided around the lower opening of each of the plurality of through holes 121.

In a printing process in which the LED 300 is mounted on a target substrate at a target position, the protrusion members 340 push a part of an LED 300 when the pickup unit 122 is introduced into the through hole 121 in order to detach the pickup unit 122 and the LED 300, which are attached to each other, so that the pickup unit 122 and the LED 300 can be easily detached from each other.

Furthermore, these protrusion members 340 may be disposed as a shape that encompasses an area corresponding to a lower opening of the through holes 121. Thus, the protrusion members 340 guide the pickup units 122 when the pickup units 122 is extruded from the lower opening of the through holes 121, and make the pickup units 122 to be detached easily when the pickup units 122 is introduced into the through holes 121.

Meanwhile, an LED transfer apparatus 100 including the above-described transfer head assembly 110 will be described with reference to FIGS. 5 and 6.

The LED transfer apparatus 100 may include the transfer head assembly 110 described above and a fixing device 510 to which the transfer head assembly 110 is installed.

The LED transfer apparatus 100 is an apparatus for transferring LEDs 300 on a wafer substrate or a carrier substrate (source substrate) to a display substrate (target substrate) on which a pixel circuit or the like is implemented, and performs functions of detaching the LEDs 300 attached to the source substrate and placing the LEDs at target positions on the target substrate.

That is, the LED transfer apparatus 100 needs to detach the LEDs 300 from the source substrate, move the LEDs 300 to the position of the target substrate, and accurately place the LEDs 300 at the target positions on the target substrate.

The method of detaching the LEDs 300 from the source substrate by the LED transfer device 100 can be variously implemented. When the LED transfer apparatus 100 includes the above-mentioned transfer head assembly 110, the pickup units 122 may be attached to the LEDs 300 to detach the LEDs 300 from the source substrate.

At this time, the transfer head assembly 110 may extrude all of the plurality of pickup units 122 so as to detach all of the LEDs 300 included in the source substrate. Alternatively, as illustrated in FIG. 6, some of the LEDs 300 included in the source substrate may be detached by extruding some of the plurality of pickup units 122.

In addition, the plurality of pickup units 122 included in the transfer head assembly 110 may correspond one-to-one to the LEDs 300 on the entire source substrate in one-to-one relation, but may correspond one-to-on to some of the LEDs 300.

Although not illustrated in the drawings, the LED transfer apparatus 100 may include a position sensor, an image sensor, or a processor configured to process obtained information in order to recognize the corresponding positions of the LEDs 300 attached to the source substrate, and to recognize the target positions on the target substrate where the moved LEDs 300 are placed (printed).

The above-described LED transfer apparatus 100 may be movable in various directions in order to place the transfer head assembly 110 on the source substrate or in order to place the LEDs 300 detached from the source substrate on the target substrate.

For this purpose, the fixing device 510 may have a support member 710 configured to install the transfer head assembly 110 thereon and a control unit 720 configured to control the movement of the support member 710.

The support member 710 supports the transfer head assembly 110 and may be located, for example, above the transfer head assembly 110 to be implemented in the form of supporting the transfer head assembly 110 in a suspended state.

In addition, as illustrated in FIG. 7, the support member 710 may include a horizontal arm 711 configured to install the transfer head assembly 110 thereon and a vertical arm 712 fixed on the ground perpendicularly and supporting the horizontal arm 711.

In this case, the control unit 720 may be configured to control a drive motor M that provides power for the upward and downward movement of the horizontal arm 711 and the rotational movement of the horizontal arm 711 around the vertical arm 712 so as to control the upward and downward movement and the rotational movement.

More specifically, the horizontal arm 711 is movable in the vertical direction while supporting the transfer head assembly 110, so that the LEDS 300 can be detached (picked up) from the source substrate or can be placed (printed) on the target substrate. The upward and downward movement of the horizontal arm 711 can be implemented in various forms. For example, the upward and downward movement may be implemented by operating the drive motor M included in the vertical arm 712 or by operating a moving motor (not illustrated) included in the connection portion between the horizontal arm 711 and the transfer head assembly 110.

In addition, the horizontal arm 711 is rotatably movable about the vertical arm 712 so that the LEDs 300 detached from the source substrate may be rotated and moved to the target substrate. The rotational movement of the horizontal arm 711 may be implemented by operating the driving motor M included in the vertical arm 712. However, the upward and downward movement and the rotational movement of the horizontal arm 711 and of the vertical arm 712 may be implemented by various types of motors, gears, or the like.

Alternatively, when a rotary motor (not illustrated) or the like is included between the horizontal arm 711 and the transfer head assembly 110, the transfer head assembly 110 may be rotated about a connection shaft which connects the transfer head assembly 110 to the horizontal arm 711.

Meanwhile, referring to FIGS. 8A and 8B, as another manner of implementing the fixing device 510, the fixing device 510 may include a support member 810 configured to install the transfer head assembly 110 thereon, a first guide rail 820, and a second guide rail 830.

There may be provided one or more first guide rails 820 that are positioned on the upper side of the support member 810 and guide the support member 810 in the lateral direction, and there may be provided one or more second guide rails 830 that are positioned on the upper side of the support member 810 and guide the support member 810 in the longitudinal direction. Here, the lateral direction means the X direction in FIG. 8B, and the longitudinal direction may mean the Y direction in FIG. 8B.

In this case, the control unit 720 may be configured to control the upward and downward movement, and the longitudinal and lateral movement of the support member 810.

In more detail, the first guide rails 820 and the second guide rail 830 may be positioned on the upper side of the support member 810 in the state in which the first guide rails 820 and the second guide rail 830 are suspended or fixed to a fixed object such as a ceiling or the like of a building, for example.

The support member 810 configured to support the transfer head assembly 110 is coupled to the first guide rails 820 and the second guide rail 830, so that the longitudinal and lateral movement of the transfer head assembly 110 are enabled along the first guide rails 820 and the second guide rail 830.

The coupling of the support member 810, the first guide rails 820, and the second guide rail 830 may be implemented in various forms.

For example, as illustrated in FIGS. 8A and 8B, the support member 810 configured to support the transfer head assembly 110 is slidably coupled to the second guide rail 830 so as to be movable in the longitudinal direction along the second guide rail 830, and the second guide rail 830 is slidably coupled to the first guide rails 820 so that the lateral movement of the support member 810 may be enabled while the second guide rail 830 moves in the lateral direction.

In this case, a drive motor (not illustrated) configured to enable a sliding movement is built in the support member 810 coupled to the second guide rail 830, a drive motor (not illustrated) configured to enable a sliding movement is built in the second guide rail 830 coupled to the first guide rails 820, and a control unit 720 controls such drive motors so as to control the longitudinal and lateral movement.

In addition, a drive motor configured to enable an upward and downward movement may be further included between the support member 810 and the transfer head assembly 110 and the control unit 720 may control the drive motor so as to control the upward and downward movement.

In this case, the support member 810 is able to detach LEDs 300 (pickup) from the source board while moving upward and downward or to place the LEDs 300 on the target substrate (placement (printing)), and the movement of the LEDs 300 between the source substrate and the target substrate may be performed while the support member 810 moves along the first guide rails 820 and the second guide rail 830.

Alternatively, a rotary motor (not illustrated) may be included between the support member 810 and the transfer head assembly 110 so that the transfer head assembly 110 may rotate about a connection shaft connected to the support member 810.

Meanwhile, the control unit 720, which causes the horizontal arm 711 or the support member 810 to move upward and downward, may be configured to cause the transfer head assembly 110 to move upward in such a manner that the rising speed of the transfer head assembly 110 when the LEDs 300 are picked up from the source substrate is higher than the rising speed of the transfer head assembly 110 when the LEDs 300 are placed (printed) on the target substrate.

This will be described with reference to FIG. 9 and FIG. 10.

The transfer head assembly 110 described above may be configured such that a portion of an extruded pickup unit 122 is adhered to an LED 300 and detaches the LED 300 from a source substrate or places the LED 300 on a target substrate.

At this time, as illustrated in FIG. 9A, the LED 300 attached to the source substrate may be in contact with the same adhesive material in each of a region A1, in which the LED 300 is in contact with the pickup unit 122, and a region A2, in which the LED 300 is in contact with the source substrate. That is, in the region A1, the pickup unit 122, which is an adhesive material, is in contact with the LED 300, and in the region A2, an adhesive material is present between the LED 300 and the source substrate such that the LED 300 and the adhesive material are in contact with each other.

In addition, as illustrated in FIG. 9B, the LED 300 placed on the target substrate may be in contact with the same adhesive material in each of a region A1 in which the LED 300 is in contact with the pickup unit 122 and a region A3 in which the LED 300 is in contact with the target substrate. That is, in the region A1, the pickup unit 122, which is an adhesive material, is in contact with the LED 300, and in the region A3, an adhesive material is present between the LED 300 and the target substrate such that the LED 300 and the adhesive material are in contact with each other.

In this case, as illustrated in FIG. 10, the adhesion strength is constant in the region A2 in which the source substrate and the LED 300 are in contact with each other and the region A3 in which the target substrate and the LED 300 are in contact with each other. However, the adhesion strength in the region A1 in which the pickup unit 122 and the LED 300 is in contact with each other is increased depending on the rising speed of the transfer head assembly 110.

This is because the pickup unit 122 includes polydimethylsiloxane (PDMS) having viscoelasticity as an adhesive material, the adhesion strengths in regions A1, A2, and A3 in which the same adhesive material is used may be regulated to be different from each other by regulating the rising speed of the transfer head assembly 110.

That is, at the time of pickup where the LED 300 is detached from the source substrate, the rising speed of the transfer head assembly 110 may be regulated in such a manner that the adhesion strength in the region A1 in which the pickup unit 122 and the LED 300 are in contact with each other is higher than the adhesion strength in the region A2 in which the LED 300 and the source substrate are in contact with each other. At the time of placing (printing) the LED 300 at a target position on the target substrate 300, the rising speed of the transfer head assembly 110 may be regulated in such a manner that the adhesion strength in the region A1 in which the pickup unit 122 and the LED 300 are in contact with each other is lower than the adhesion strength in the region A3 in which the LED 300 and the target substrate are in contact with each other.

That is, the control unit 720 may cause the transfer head assembly 110 to move upward in such a manner that the rising speed of the transfer head assembly 110 at the time of picking up the LED 300 is higher than the rising speed of the transfer head assembly 110 at the time of placing (printing) the LED 300.

This makes it possible to smoothly transfer the LED 300 by adjusting the adhesion strength of the pickup unit 122 including the same adhesive material to vary depending on the pickup/placing (printing) operation.

Meanwhile, at the time of placing (printing) the LED, the control unit 720 regulates the rising speed of the transfer head assembly 110 such that the LED 300 is placed (printed) on the target substrate, and when the actuator 124 is turned off to cause the pickup unit 122 to be introduced into the through hole 121, the above-mentioned protrusion members 340 push the LED 300. Thus, the LED 300 can be more smoothly placed (printed) on the target substrate.

As described above, according to the embodiments of the present disclosure, a large number of LEDs located on a wafer substrate or a carrier substrate can be transferred in bulk to a display substrate. Thus, it is possible to rapidly perform the transfer process of the LEDs.

According to the embodiments of the present disclosure, a plurality of LEDs located on a wafer substrate or a carrier substrate can be selectively transferred to a display substrate. Thus, it is possible to facilitate the repair process of defective or low-quality LEDs.

In addition, according to the embodiments of the present disclosure, a plurality of LEDs located on a wafer substrate or a carrier substrate can be transferred to a display substrate while applying a minimum external force to the LEDs. Thus, it is possible to reduce the possibility of damaging the LEDs.

Even if it was described above that all of the components of an embodiment of the present disclosure are coupled as a single unit or coupled to be operated as a single unit, the present disclosure is not necessarily limited to such an embodiment. That is, at least two elements of all structural elements may be selectively joined and operate without departing from the scope of the present disclosure.

In addition, since terms, such as including, comprising, and having mean that one or more corresponding components may exist unless they are specifically described to the contrary, it shall be construed that one or more other components can be included. All the terms that are technical, scientific or otherwise agree with the meanings as understood by a person skilled in the art unless defined to the contrary. Common terms as found in dictionaries should be interpreted in the context of the related technical writings not too ideally or impractically unless the present disclosure expressly defines them so.

Although a preferred embodiment of the present disclosure has been described for illustrative purposes, those skilled in the art will appreciate that various modifications, additions and substitutions are possible, without departing from the scope and spirit of the disclosure as disclosed in the accompanying claims. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

CROSS-REFERENCE TO RELATED APPLICATION

This application claims priority from Korean Patent Application No. 10-2017-0176334, filed on Dec. 20, 2017, which is hereby incorporated by reference for all purposes as if fully set forth herein.

The invention claimed is:

1. A light emitting diode (LED) transfer apparatus comprising:
   a transfer head assembly configured to pick up an LED; and
   a fixing device having a support member configured to install the transfer head assembly thereon and a control unit configured to control a movement of the support member,
   wherein the transfer head assembly includes:
   a head plate having therein a through hole;
   a pickup unit configured to correspond to the through hole and formed of a first adhesive material filled in an inner portion of the through hole such the LED is attachable to the pickup unit;

a pressing unit configured to cover an upper portion of the through hole in correspondence with the pickup unit and to apply pressure to the pickup unit depending on pressure applied to an upper surface thereof;
an actuator configured to press the upper surface of the pressing unit; and
a drive circuit configured to drive the actuator,
wherein the first adhesive material is a same material as a second adhesive material between the LED and a source substrate, and a third adhesive material between the LED and a target substrate,
wherein at a time of pickup of the LED, the drive circuit adjusts a rising speed of the transfer head assembly such that an adhesive force in a region where the pickup unit and the LED come into contact is greater than an adhesive force in a region where the LED and the source substrate come into contact,
wherein at a time of placing the LED, the drive circuit adjusts a rising speed of the transfer head assembly such that the adhesive force in the region where the pickup unit and the LED come into contact is smaller than the adhesive force in the region where the LED and the source substrate come into contact.

2. The LED transfer apparatus of claim 1, wherein the actuator is a piezoelectric actuator configured to generate a load by polarization of a piezoelectric ceramic provided therein.

3. The LED transfer apparatus of claim 1, wherein the transfer head assembly further comprises a base plate coupled to the head plate on an upper side of the head plate and configured to support the actuator.

4. The LED transfer apparatus of claim 3, wherein the head plate is detachably coupled to the base plate.

5. The LED transfer apparatus of claim 1, wherein
on a lower surface of the head plate,
a protrusion member is provided around a lower opening of the through hole.

6. The LED transfer apparatus of claim 1, wherein the through hole is configured such that a width of a lower opening of the through hole is smaller than a width of an upper opening of the through hole.

7. The LED transfer apparatus of claim 1, wherein the through hole is configured such that a width of a lower opening of the through hole is smaller than a width of the actuator.

8. The LED transfer apparatus of claim 1, wherein the pickup unit comprises polydimethylsiloxane (PDMS) as an adhesive material.

9. The LED transfer apparatus of claim 1, wherein the pickup unit is configured to be extruded from the inner portion of the through hole to a lower side of the head plate according to pressure applied by a portion of the pressing unit while the portion of the pressing unit is bent as the load generated by driving the actuator is transferred to the upper surface of the pressing unit.

10. The LED transfer apparatus of claim 1, wherein the support member of the fixing device has a horizontal arm configured to install the transfer head assembly thereon and a vertical arm fixed to be vertical to a ground and configured to support the horizontal arm, and
the control unit of the fixing device is configured to control an upward and downward movement of the horizontal arm and a rotational movement of the horizontal arm about the vertical arm.

11. The LED transfer apparatus of claim 10, wherein the control unit is configured to control the rising speed of the transfer head assembly in such a manner that the rising speed when the LED is picked up is higher than the rising speed of the transfer head assembly when the LED is placed.

12. The LED transfer apparatus of claim 1, wherein the fixing device further comprises at least one first guide rail located on an upper side of the support member and configured to guide the support member in a lateral direction and at least one second guide rail located on the upper side of the support member and configured to guide the support member in a longitudinal direction, and
the control unit of the fixing device is configured to control an upward and downward movement of the support member and a longitudinal and lateral movement of the support member.

13. A transfer head assembly comprising:
a head plate having a plurality of through holes;
a pickup unit configured to correspond to the through holes and formed of a first adhesive material filled in an inner portion of the through holes such that a light emitting diode (LED) is attachable to the pickup unit;
a pressing unit configured to cover an upper portion of the through holes in correspondence with the pickup unit and to apply pressure to the pickup unit; and
a drive circuit configured to drive the pressing unit,
wherein the pickup unit is configured to be extruded from an inner portion of the through holes to a lower side of the head plate according to the pressure applied by the pressing unit,
wherein the first adhesive material is a same material as a second adhesive material between the LED and a source substrate, and a third adhesive material between the LED and a target substrate,
wherein at a time of pickup of the LED, the drive circuit adjusts a rising speed of the head plate such that an adhesive force in a region where the pickup unit and the LED come into contact is greater than an adhesive force in a region where the LED and the source substrate come into contact,
wherein at a time of placing the LED, the drive circuit adjusts a rising speed of the head plate such that the adhesive force in the region where the pickup unit and the LED come into contact is smaller than the adhesive force in the region where the LED and the source substrate come into contact.

14. The transfer head assembly of claim 13, wherein the pressing unit is configured to generate a load by polarization of a piezoelectric ceramic provided therein.

15. The transfer head assembly of claim 13, wherein the pressing unit is disposed to be overlapped with an upper opening of the through holes and an upper surface of the pickup unit.

16. The transfer head assembly of claim 13, wherein the through hole is configured such that a width of a lower opening of each through hole is smaller than a width of an upper opening of each through hole.

17. The transfer head assembly of claim 13, wherein
on a lower surface of the head plate,
a protrusion member is provided around a lower opening of the through holes.

18. The transfer head assembly of claim 17, wherein the protrusion member is provided as a shape that encompasses an area corresponding to the lower opening of the through holes, and configured to guide the pickup unit extruded from the lower opening of the through holes.

19. The transfer head assembly of claim 13, wherein the drive circuit configured to control the pressing unit disposed on each of the plurality of the through holes independently.

20. A transfer head assembly comprising:
- a head plate having a plurality of through holes, wherein a size of an upper opening of the through holes is different from a size of a lower opening of the through holes;
- a first adhesive material configured to be filled in an inner portion of each of the plurality of through holes such that a light emitting diode (LED) is attachable to the head plate;
- a pressing unit configured to be disposed on each of the plurality of through holes;
- an actuator configured to be disposed on the pressing unit and include a piezoelectric ceramic; and
- a drive circuit configured to apply an electric signal to the actuator and control the adhesive material to be extruded from or be introduced into the lower opening of the through holes,
- wherein the first adhesive material is a same material as a second adhesive material between the LED and a source substrate, and a third adhesive material between the LED and a target substrate,
- wherein at a time of pickup of the LED, the drive circuit adjusts a rising speed of the head plate such that an adhesive force in a region where the first adhesive material and the LED come into contact is greater than an adhesive force in a region where the LED and the source substrate come into contact,
- wherein at a time of placing the LED, the drive circuit adjusts a rising speed of the head plate such that the adhesive force in the region where the first adhesive material and the LED come into contact is smaller than the adhesive force in the region where the LED and the source substrate come into contact.

* * * * *